US012787590B2

(12) United States Patent
Jeon et al.

(10) Patent No.: US 12,787,590 B2
(45) Date of Patent: Nov. 3, 2026

(54) DISPLAY DEVICE

(71) Applicant: Samsung Display Co., LTD., Yongin-si (KR)

(72) Inventors: Baek Kyun Jeon, Yongin-si (KR); Young Gu Kim, Yongin-si (KR); Jiyun Park, Hwaseong-si (KR); Bong-Sung Seo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 532 days.

(21) Appl. No.: 18/107,478

(22) Filed: Feb. 8, 2023

(65) Prior Publication Data

US 2023/0255083 A1 Aug. 10, 2023

(30) Foreign Application Priority Data

Feb. 9, 2022 (KR) ........................ 10-2022-0017183

(51) Int. Cl.
*H10K 59/38* (2023.01)
*C08G 77/54* (2006.01)

(52) U.S. Cl.
CPC ............ *H10K 59/38* (2023.02); *C08G 77/54* (2013.01)

(58) Field of Classification Search
CPC ...... H10K 59/87; H10K 59/38; C08G 77/452; G03F 7/0757
See application file for complete search history.

(56) References Cited

U.S. PATENT DOCUMENTS 8,405,063 B2 3/2013 Kazlas et al.
2010/0159255 A1 6/2010 Lee et al.
(Continued)

FOREIGN PATENT DOCUMENTS

KR 1020100071650 A 6/2010
KR 1020180052161 5/2018
(Continued)

OTHER PUBLICATIONS

Jincheol Kim, et al., "Inorganic Encapsulation Method Using Solution-Processible Polysilazane for Flexible Solar Cells", ACS Applied Energy Materials, (2020), vol. 3, pp. 9257-9263.
(Continued)

*Primary Examiner* — Alia Sabur
(74) *Attorney, Agent, or Firm* — CANTOR COLBURN LLP

(57) ABSTRACT

A display device includes: a display portion including a plurality of pixels; and a color conversion portion overlapping the display portion. The color conversion portion includes: a first color conversion portion, a second color conversion portion, a transmissive portion, and a light blocking portion, the first color conversion portion includes: a first color conversion layer including first semiconductor nanocrystals and a first color filter overlapping the first color conversion layer, the second color conversion portion includes: a second color conversion layer including second semiconductor nanocrystals and a second color filter overlapping the second color conversion layer, and the transmissive portion includes: a transmissive layer. The color conversion portion further includes an insulation layer positioned between the first color conversion layer and the first color filter, and the insulation layer contacts both the first color conversion layer and the first color filter.

16 Claims, 5 Drawing Sheets

(56) References Cited

U.S. PATENT DOCUMENTS

| | | | | |
|---|---|---|---|---|
| 2015/0188006 | A1* | 7/2015 | Williams | H10H 20/854 438/26 |
| 2019/0047258 | A1* | 2/2019 | Suematsu | H10K 71/60 |
| 2019/0288227 | A1* | 9/2019 | Kojima | G02B 5/20 |
| 2020/0312916 | A1* | 10/2020 | Kim | H10K 59/38 |
| 2021/0005672 | A1* | 1/2021 | Lee | H10K 59/38 |
| 2021/0217816 | A1 | 7/2021 | Ha et al. | |

FOREIGN PATENT DOCUMENTS

| | | |
|---|---|---|
| KR | 1020180087502 | 8/2018 |
| KR | 1020190078721 | 7/2019 |
| KR | 1020210091384 A | 7/2021 |

OTHER PUBLICATIONS

Ying Zhan, et al., "Evaluation of mechanical properties and hydrophobicity of room-temperature, moisture-curable polysilazane coatings", J Appl Polym Science, (2021), vol. 138, pp. 1-10.

* cited by examiner

DISPLAY DEVICE

This application claims priority to Korean Patent Application No. 10-2022-0017183, filed on Feb. 9, 2022, and all the benefits accruing therefrom under 35 U.S.C. § 119, the content of which in its entirety is herein incorporated by reference.

BACKGROUND

(a) Field

The present disclosure relates to a display device.

(b) Description of the Related Art

A display device including a color conversion layer using semiconductor nanocrystals such as quantum dots has been proposed to reduce light loss caused by color filters and to realize a display device with high color reproducibility.

SUMMARY

Embodiments are for simplifying a manufacturing process and providing an excellent display device with a barrier characteristic.

A display device according to an embodiment includes: a display portion including a plurality of pixels; and a color conversion portion overlapping the display portion. The color conversion portion includes: a first color conversion portion, a second color conversion portion, a transmissive portion, and a light blocking portion, the first color conversion portion includes: a first color conversion layer including first semiconductor nanocrystals and a first color filter overlapping the first color conversion layer, the second color conversion portion includes: a second color conversion layer including second semiconductor nanocrystals and a second color filter overlapping the second color conversion layer, and the transmissive portion includes: a transmissive layer. The color conversion portion further includes an insulation layer positioned between the first color conversion layer and the first color filter, and the insulation layer contacts both the first color conversion layer and the first color filter.

The insulation layer may be continuously disposed across the first color conversion portion, the second color conversion portion, and the transmissive portion.

The insulation layer may contact the first color conversion layer, the second color conversion layer, and the transmissive layer.

The transmissive portion may further include a third color filter overlapping the transmissive layer, and the insulation layer may contact the first color filter, the second color filter, and the third color filter.

The insulation layer may be a single layer.

The insulation layer may include a polysilazane-based compound.

The polysilazane-based compound may include a compound represented by Chemical Formula 1:

(Chemical Formula 1)

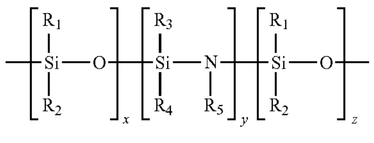

in Chemical Formula 1, $R_1$ and $R_2$ each independently include at least one of hydrogen, oxygen, nitrogen, an alkyl group, an epoxy group, and an acrylate group, $R_3$ and $R_4$ each independently contains an alkyl group or acrylate group having 1 to 5 carbon atoms, $R_5$ contains any one of an alkyl group, a methoxy, and a double bond, and x, y, and z are random numbers among 1 to 10, respectively.

In Chemical Formula 1, the sum of x and z may be less than or equal to y.

In Chemical Formula 1, $R_1$ and $R_2$ may be combined with the first color conversion layer, the second color conversion layer, and the transmissive layer.

The insulation layer may be formed through an inkjet process.

A thickness of the insulation layer may be about 50 nanometers to about 5 micrometers.

A display device according to an embodiment includes: a display portion including a plurality of pixels: and a color conversion portion overlapping the display portion. The color conversion portion includes: a first color conversion portion, a second color conversion portion, and a transmissive portion, the first color conversion portion includes: a first color conversion layer including first semiconductor nanocrystals and a first color filter overlapping the first color conversion layer, the second color conversion portion includes: a second color conversion layer including second semiconductor nanocrystals and a second color filter overlapping the second color conversion layer, and the transmissive portion includes: a transmissive layer and a third color filter overlapping the transmissive layer. The color conversion portion further includes an insulation layer positioned between the first color conversion layer and the first color filter, and the insulation layer contacts both the first color conversion layer and the first color filter, and the insulation layer contains an organic-inorganic hybrid material.

According to the embodiments, a display device of which a manufacturing process is simplified and a barrier characteristic is excellent can be provided.

DETAILED DESCRIPTION

Figure 1:
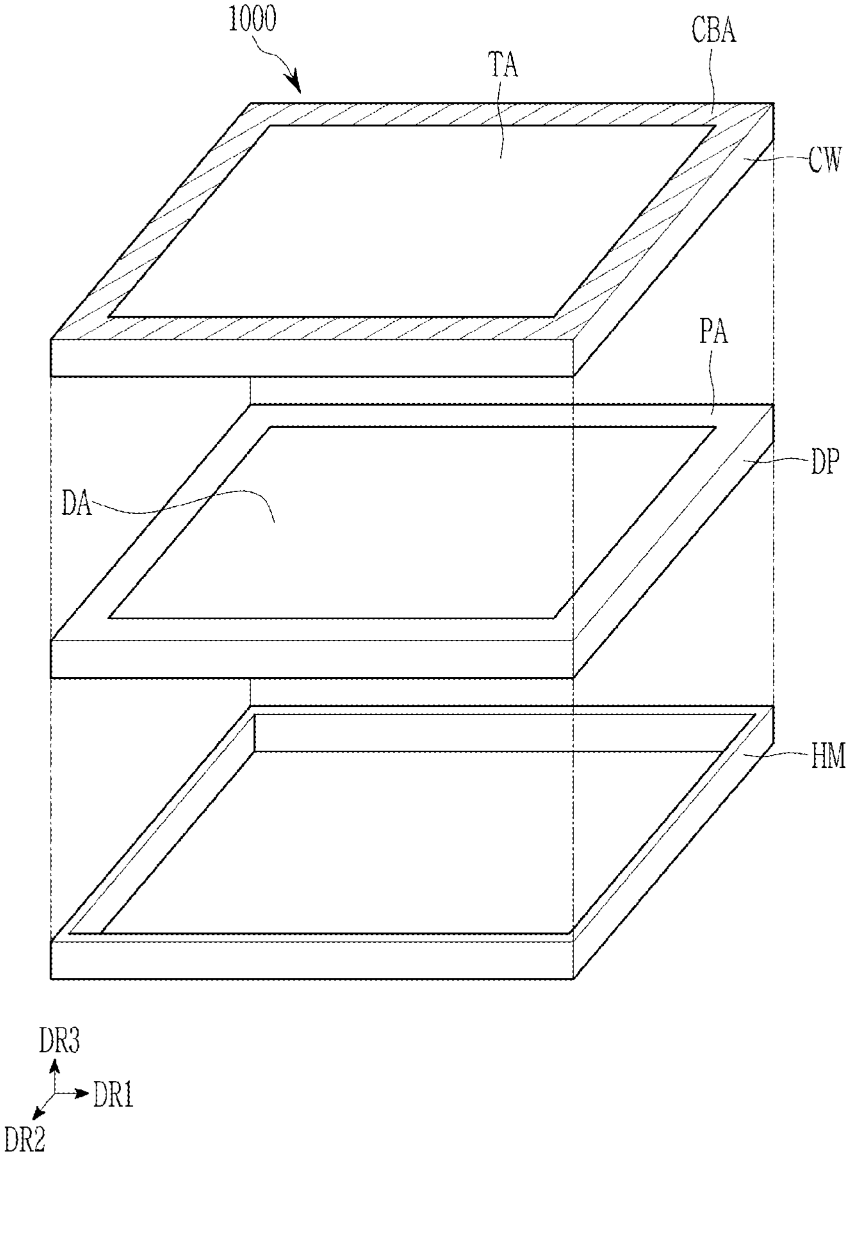
FIG. 1 is a schematic exploded perspective view of a display device according to an embodiment.

Hereinafter, with reference to the accompanying drawing, various embodiments of the present invention will be described in detail and thus a person of an ordinary skill can easily practice it in the technical field to which the present invention belongs. The present invention may be implemented in several different forms and is not limited to the embodiments described herein.

In order to clearly explain the present invention, parts irrelevant to the description are omitted, and the same reference numeral is attached to the same or similar constituent elements throughout the specification.

In addition, since the size and thickness of each component shown in the drawing are arbitrarily indicated for better understanding and ease of description, the present invention is not necessarily limited to the illustrated drawings. In the drawings, the thickness of layers, films, panels, regions, etc., are exaggerated for clarity. In addition, in the drawing, the thickness of some layers and regions is exaggerated for better understanding and ease of description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to an embodiment will be described with reference to FIG. 1. FIG. 1 is a schematic exploded perspective view of a display device according to an embodiment.

Referring to FIG. 1, a display device 1000 according to an exemplary embodiment may include a cover window CW, a display panel DP, and a housing HM.

The cover window CW may include an insulation panel. For example, the cover window CW may be made of glass, plastic, or a combination thereof.

A front of the cover window CW may define a front of the display device 1000. The transmissive area TA may be an optically transparent area. For example, the transmissive area TA may be an area having visible ray transmittance of about 90% or more.

A blocking area CBA may define the shape of the transmissive area TA. The blocking area CBA is adjacent to the transmissive area TA and may surround the transmissive area TA. The blocking area CBA may be an area having relatively low light transmittance compared to the transmissive area TA. The blocking area CBA may include an opaque material that blocks light. The blocking area CBA may have a predetermined color. The blocking area CBA may be defined by a bezel layer provided separately from a transparent substrate defining the transmissive area TA, or may be defined by an ink layer formed by inserting or coloring the transparent substrate.

One plane of the display panel DP where the image is displayed is parallel to a plane defined by a first direction DR1 and a second direction DR2. A third direction DR3 indicates the normal direction of one side where the image is displayed, that is, a thickness direction of the display panel DP. The front (or top) and rear (or bottom) of each member are separated by the third direction DR3. However, the directions indicated by the first to third directions DR1, DR2, and DR3 are relative concepts and may be converted to other directions.

The display panel DP may be a flat rigid display panel, but is not limited thereto and may be a flexible display panel. On the other hand, the display panel DP may be made of organic light emitting panel. However, the type of display panel DP is not limited thereto, and various types of panels may be used. For example, the display panel DP may be formed of a liquid crystal panel, an electrophoretic display panel, an electrowetting display panel, and the like. In addition, the display panel DP may be formed of the next generation display panel such as a micro light emitting diode display panel, a quantum dot light emitting diode display panel, and a quantum dot organic light emitting diode ("OLED") display panel.

The micro light emitting diode display panel is formed by forming a 10 to 100 micrometer size light emitting diode for each pixel. Such a micro light emitting diode display panel uses inorganic materials, a backlight can be omitted, reaction speed is fast, may realize high luminance with low power, and has merits such as not being broken when bent. The quantum dot light emitting diode display panel is formed by attaching a film containing quantum dots or forming a material containing quantum dots. Quantum dots are made of inorganic materials such as indium and cadmium, and refer to particles that are self-emissive and have a diameter of several nanometers or less. By controlling the particle size of quantum dots, light of a desired color can be displayed. The quantum dot organic light emitting diode display panel uses blue organic light emitting diode as a light source, and a film containing red and green quantum dots is attached thereon, or a material containing red and green quantum dots maybe deposited such that color is realized. The display panel DP according to the embodiment may be formed of various display panels other than the above-stated panels.

As shown in FIG. 1, the display panel DP includes a display area DA where an image is displayed and a non-display area PA adjacent to the display area DA. The non-display area PA is an area where no image is displayed. The display area DA may have a rectangular shape, for example, and the non-display area PA may have a shape surrounding the display area DA. However, the present invention is not limited thereto, and the shapes of the display area DA and the non-display area PA may be relatively designed.

The housing HM provides a predetermined internal space. The display panel DP is mounted inside the housing HM. In addition to the display panel DP, various electronic components such as a power supply, storage, and a sound input and output module can be mounted inside the housing HM.

Figure 2:
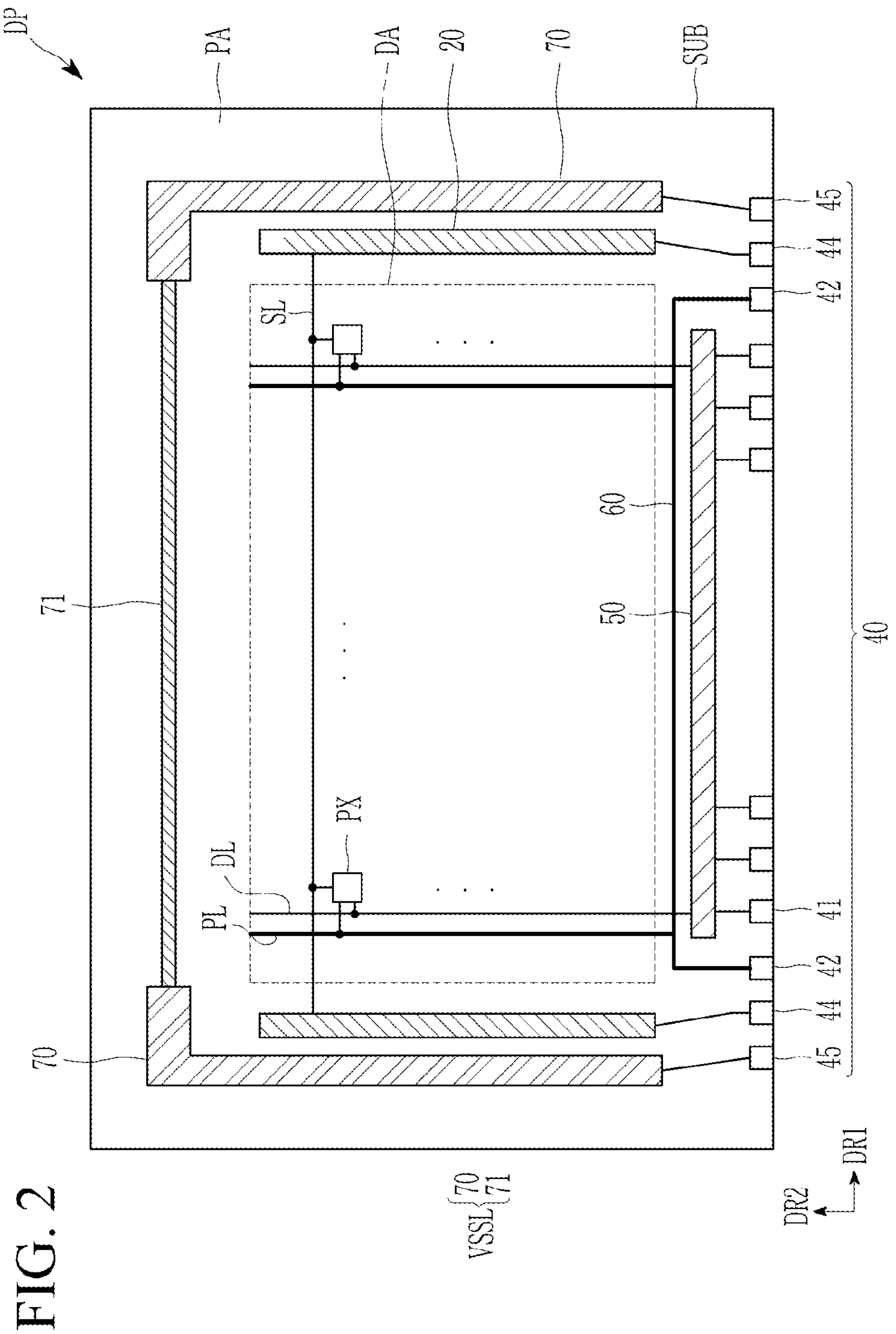
FIG. 2 is a top plan view of some area of a display panel according to an embodiment.

Hereinafter, referring to FIG. 2, a display panel according to an embodiment will be described. FIG. 2 is a top plan view of some area of a display panel according to an embodiment. Here, the plan view means a view in the third direction DR3.

Referring to FIG. 2, a display panel DP includes a display area DA and a non-display area PA. The non-display area PA may be defined along an edge of the display area DA.

The display panel DP includes a plurality of pixels PX. The plurality of pixel PXs may be disposed in the display area DA on a substrate SUB. Each pixel PX includes an organic light emitting diode and a pixel driving circuit connected thereto.

Each pixel PX emits light of, for example, red, green, and blue or white, and may include, for example, an organic light emitting diode. The display panel DP provides a predetermined image through the light emitted from the pixels PX, and the display area DA is defined by the pixels PX. In the present specification, the non-display area PA indicates a region where the pixel PXs are not disposed and does not provide an image.

The display panel DP may include a plurality of signal lines and a pad portion. A plurality of signal lines may include a scan line SL extending in a first direction DR1, a data line DL and a driving voltage line PL extending in a second direction DR2, and the like.

The scan driver 20 is positioned in the non-display area PA on the substrate SUB. The scan driver 20 generates and transmits a scan signal to each pixel PX through the scan line SL. Depending on embodiments, the scan driver 20 may be disposed to the left and right sides of the display area DA. Although the present specification shows a structure in which the scan drivers 20 are disposed on both sides of the display area DA, as another embodiment, the scan driver may be disposed only on one side of the display area DA.

The pad portion 40 is disposed to one end of the display panel DP, and includes a plurality of terminals 41, 42, 44, and 45. The pad portion 40 is exposed without being covered by the insulation layer, and thus it may be electrically connected to a controller (not shown) such as a flexible printed circuit board or an IC chip.

The controller converts a plurality of video signals transmitted from the outside into a plurality of image data signals, and transmits the changed signal to the data driver 50 through the terminal 41. In addition, the controller may receive a vertical synchronization signal, a horizontal synchronization signal, and a clock signal, generate a control signal to control the operation of the scan driver 20 and the data driver 50, and transmit it to each through terminals 44 and 41. The controller delivers a driving voltage ELVDD to a driving voltage supply line 60 through the terminal 42. The controller also transmits a common voltage to each of common voltage supply lines VSSL through the terminal 45.

The data driver 50 is disposed on the non-display area PA, and generates and transmits a data signal to each pixel PX through a data line DL. The data driver 50 may be disposed on one side of the display panel DP, and may be disposed between, for example, the pad portion 40 and the display area DA.

The driving voltage supply line 60 is disposed on the non-display area PA. For example, the driving voltage supply line 60 may be disposed between the data driver 50 and the display area DA. The driving voltage supply line 60 provides the driving voltage to the pixel PXs. The driving voltage supply line 60 may be disposed in a first direction DR1 and may be connected to a plurality of driving voltage lines PL disposed in a second direction DR2.

The common voltage supply line VSSL is disposed on the non-display area PA and provides a common voltage to the common electrode of the organic light emitting diode of the pixel PX. The common voltage supply line VSSL may extend from one side of the substrate SUB to form a closed loop surrounding three sides along the edge of the substrate SUB. The common voltage supply line VSSL may include a main supply line 70 and a sub-supply line 71, and the like.

Figure 3:
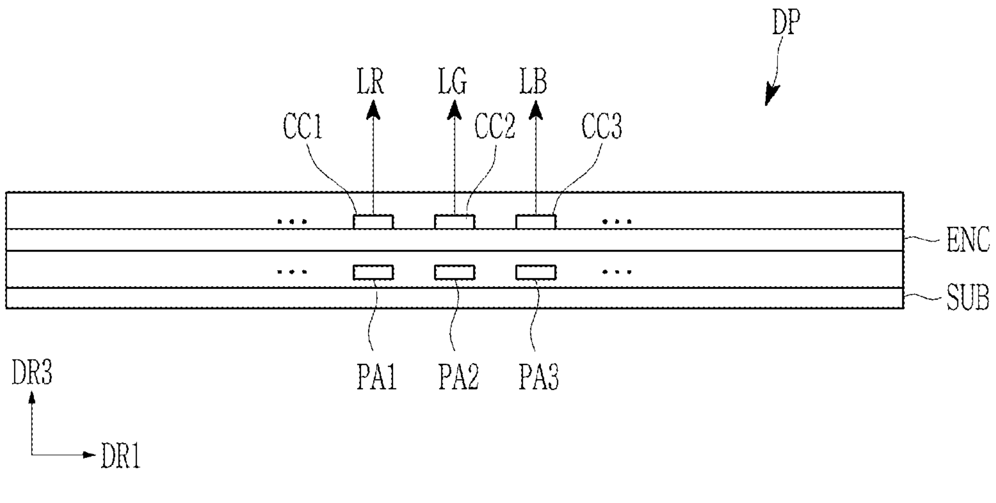
FIG. 3 is a schematic cross-sectional view of the display panel according to the embodiment.
Figure 4:
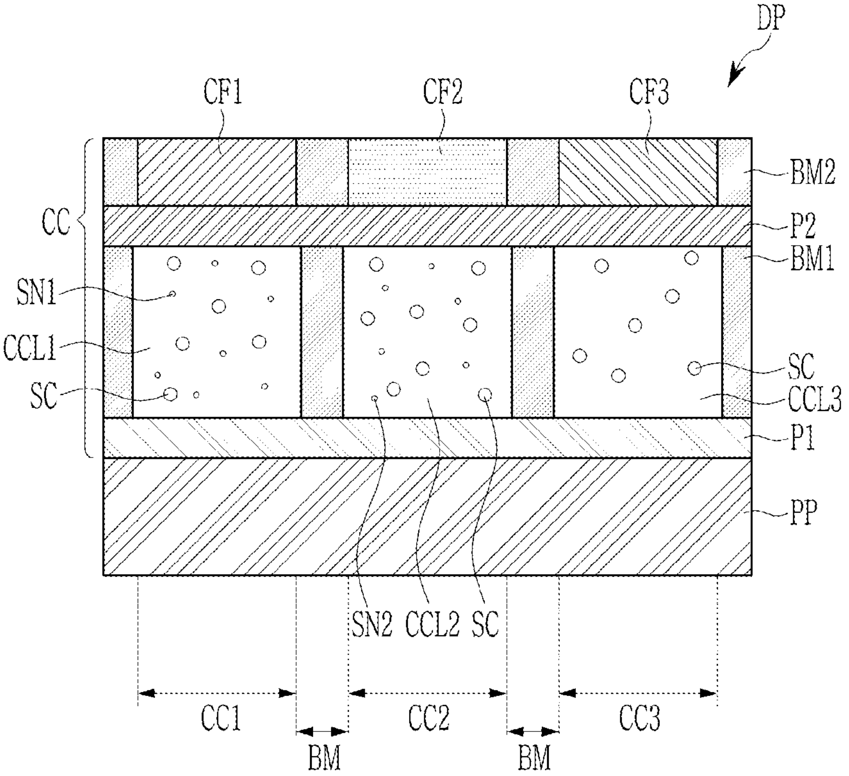
FIG. 4 is a cross-sectional view of the display panel according to the embodiment.

Hereinafter, a display area of the display device according to the embodiment will be described with reference to FIG. 3 and FIG. 4. FIG. 3 is a schematic cross-sectional view of the display panel according to the embodiment, and FIG. 4 is a cross-sectional view of the display panel according to the embodiment.

Referring to FIG. 3, a plurality of pixels PA1, PA2, and PA3 may be formed on the substrate SUB that corresponds to the display area DA. Each of the pixels PA1, PA2, and PA3 may include a plurality of transistors and a light emitting diode connected thereto.

An encapsulation layer ENC may be positioned on the plurality of pixels PA1, PA2, and PA3. The display area DA may be protected from external air or moisture through the encapsulation layer ENC. The encapsulation layer ENC may be integrally provided to overlap the front surface of the display area DA in a plan view, and may be partially disposed on the non-display area PA.

A first color conversion portion CC1, a second color conversion portion CC2, and a transmission part CC3 may be positioned on the encapsulation layer ENC. The first color conversion portion CC1 may overlap the first pixel PA1, the second color conversion portion CC2 may overlap the second pixel PA2, and a transmissive portion CC3 may overlap the third pixel PA3 in a plan view.

Light emitted from the first pixel PA1 may pass through the first color conversion portion CC1 to provide red light LR. Light emitted from the second pixel PA2 may pass through the second color conversion portion CC2 to provide green light LG. Light emitted from the third pixel PA3 may pass through the transmission part CC3 to provide blue light LB.

Hereinafter, a stacked structure of the pixels PA1, PA2, and PA3 and a stacked structure of the color conversion portions CC1 and CC2 and the transmissive portion CC3 will be described. Referring to FIG. 4, a color conversion portion CC may be positioned on a display portion PP including the first to third pixels PA1, PA2, and PA3.

Referring to FIG. 4, a first insulation layer P1 may be positioned between the display portion PP and the color conversion portion CC. The first insulation layer P1 may include an organic material or an inorganic material. When the first insulation layer P1 includes an inorganic material, the inorganic material may be a single layer or multiple layers including at least one of a silicon oxide ($SiO_x$), a silicon nitride ($SiN_x$), and a silicon oxynitride ($SiO_xN_y$). Depending on embodiments, the first insulation layer P1 can be omitted.

The color conversion portion CC includes the first color conversion portion CC1, the second color conversion portion CC2, the transmissive portion CC3, and a light blocking portion BM positioned therebetween. The light blocking portion BM may be positioned between the first color conversion portion CC1 and the second color conversion portion CC2, between the second color conversion portion CC2 and the transmissive portion CC3, and between the transmissive portion CC3 and the first color conversion portion CC1.

A first light blocking member BM1 of the light blocking portion BM may be positioned on the first insulation layer P1. The first light blocking member BM1 may define a region in which the first color conversion layer CCL1, the second color conversion layer CCL2 and the transmission layer CCL3 are positioned.

The first color conversion layer CCL1, the second color conversion layer CCL2, and the transmissive layer CCL3 may be positioned in the region defined by the first light blocking member BM1. The first color conversion layer CCL1, the second color conversion layer CCL2, and the transmissive layer CCL3 may be formed by an inkjet process, but is not limited thereto, and may be formed using any manufacturing method.

The first color conversion portion CC1 may include a first color conversion layer CCL1, the second color conversion portion CC2 may include a second color conversion layer CCL2, and the transmissive portion CC3 may include a transmissive layer CCL3.

The transmissive layer CCL3 transmits light of a first wavelength incident from the display portion PP, and may include a plurality of scatterers. In this case, the light of the first wavelength may be blue light of which a maximum light emitting peak wavelength is about 380 nanometers (nm) to about 480 nm, for example, about 420 nm or more, about 430 nm or more, about 440 nm or more, or about 445 nm or more, and about, 470 nm or less, about 460 nm or less, or about 455 nm or less.

The first color conversion layer CCL1 may color-convert light of a first wavelength incident from the display portion PP into red light, and may include a plurality of scatterers SC and a plurality of first quantum dots SN1 (e.g., semiconductor nanocrystals). In this case, the red light may have a maximum light emitting peak wavelength of about 600 nm to about 650 nm, for example, about 620 nm to about 650 nm.

The second color conversion layer CCL2 converts the light of the first wavelength incident from the display panel into green light, and may include a plurality of scatterers and a plurality of second quantum dots SN2 (e.g., semiconductor nanocrystals). The green light may have a maximum light emitting peak wavelength of about 500 nm to about 550 nm, for example, about 510 nm to about 550 nm.

A plurality of scatterers may scatter light incident on the first color conversion layer CCL1, the second color conversion layer CCL2, and the transmissive layer CCL3 to increase light efficiency.

Each of the first quantum dot SN1 and the second quantum dot SN2 (hereinafter, also referred to as semiconductor nanocrystal) may include a group II-VI compound, a group III-V compound, a group IV-VI compound, a group IV element or compound, a I-III-group VI compound, a group compound, a group I-II-IV-VI compound, or a combination thereof. The quantum dot may not contain cadmium.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and a mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The II-VI compound may further include a group III-IV metal.

The group III-V compound may be selected from a group consisting of a binary compound selected from a group consisting of GaN, GaP, GaAs, GaSb, AlN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The III-V compound may further include a group II metal (e.g., InZnP).

The group IV-VI compound may be selected from a group consisting of a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; and a quaternary compound selected from a group consisting of SnPbSSe, SnPbSeTe, SnPbSTe, and a mixture thereof.

The group IV element or compound is a single element compound selected from a group consisting of Si, Ge, and a combination thereof; and a binary compound selected from a group consisting of SiC, SiGe, and a combination thereof, but is not limited thereto.

Examples of the group I-III-VI compound include, but are not limited to, CuInSe2, CuInS2, CuInGaSe, and CuInGaS. Examples of the group I-II-IV-VI compound include, but are not limited to, CuZnSnSe and CuZnSnS. The group IV element or compound is a single element selected from a group consisting of Si, Ge, and a mixture thereof; and a binary compound selected from a group consisting of SiC, SiGe, and a mixture thereof.

The Group II-III-VI compound may be selected from a group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgGaTe, HgInS, HgGaSe, HgAlSe, HgGaSe, HgAlSe, HgGaSe, HgAlSe, HgInTe, MgGaS, MgAlS, MgInS, MgGaSe, MgAlSe, MgInSe, and a combination thereof, but is not limited thereto.

The group I-II-IV-VI compound may be selected from, but is not limited to, CuZnSnSe and CuZnSnS.

In one embodiment, the quantum dot may not contain cadmium. Quantum dots may contain semiconductor nanocrystals based on group III-V compounds including indium and phosphorus. The III-V compound may further include zinc. The quantum dot may include a semiconductor nanocrystal based on a group II-VI compound including a chalcogen element (e.g., sulfur, selenium, tellurium, or a combination thereof) and zinc.

In the quantum dot, the above-mentioned binary compound, ternary element compound, and/or quaternary compound may exist in a particle at a uniform concentration, or may exist in the same particle with concentration distribution partially divided into different states. In addition, one quantum dot may have a core/shell structure surrounding another quantum dot. The interface between the core and the shell may have a concentration gradient in which the concentration of elements present in the shell decreases toward the center.

In some embodiments, a quantum dot may have a core-shell structure including a core containing the nanocrystals described above and a shell surrounding the core. The shell of the quantum dot may serve as a protective layer to maintain the semiconductor characteristic by preventing chemical denaturation of the core and/or as a charging layer to impart an electrophoretic characteristic to the quantum dot. The shell may be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

For example, the metal or non-metal oxide may be exemplarily a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like or a ternary compound such as $MgAl_2O_4$, $CoFe_2O_4$, $NiFe_2O_4$, $CoMn_2O_4$, and the like.

In addition, the semiconductor compound may be exemplarily CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the present invention is not limited thereto.

The interface between the core and the shell may have a concentration gradient in which the concentration of elements present in the shell decreases toward the center. In addition, the semiconductor nanocrystal may have a structure including one semiconductor nanocrystal core and a multi-layered shell surrounding the semiconductor nanocrystal core. In one implementation, the multi-layered shell may have two or more layers, for example, two, three, four, five, or more layers. Two adjacent layers of the shell may have a single composition or a different composition. In a multi-layered shell, each layer may have a composition that varies along the radius.

The quantum dot may have a full width at half maximum ("FWHM") of the light emitting wavelength spectrum of about 45 nm or less, preferably about 40 nm or less, more preferably about 30 nm or less, and within such a range, color purity or color reproducibility can be improved. In addition, the light emitted through the quantum dot is emitted in all directions, and thus the light viewing angle can be improved.

In the quantum dot, the shell material and the core material may have different energy bandgap. For example, the energy bandgap of the shell material may be greater than the energy bandgap of the core material. In other embodiments, the energy bandgap of the shell material may be smaller than the energy bandgap of the core material. The quantum dot may have a multi-layered shell. In a multi-layered shell, the energy bandgap of the outer layer may be larger than the energy bandgap of the inner layer (i.e., the layer closer to the core). In a multi-layered shell, the energy bandgap of the outer layer may be smaller than the energy bandgap of the inner layer.

The quantum dot may control absorption/light emitting wavelength by controlling composition and size. The maximum light emitting peak wavelength of the quantum dot may have a wavelength range of ultraviolet ("UV") to infrared wavelength or higher.

The quantum dot may contain an organic ligand (e.g., having a hydrophobic moiety and/ or a hydrophilic moiety). The organic ligand moiety may be bound to the surface of the quantum dot. The organic ligand moiety may include RCOOH, RNH2, R2NH, R3N, RSH, R3PO, R3P, ROH, RCOOR, RPO (OH)2, RHPOOH, R2POOH, or a combination thereof. Here, R may each be independently C3 to C40 substituted or unsubstituted aliphatic hydrocarbon group such as C3 to C40 (e.g., C5 or more and C24 or less) substituted or unsubstituted alkyl, substituted or unsubstituted alkenyl, and the like, or may be a substituted or unsubstituted aromatic hydrocarbon group of C6 to C40 (e.g., C6 or more and C20 or less), such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, and benzyl thiol;

amines such as methanamine, ethanamine, propane amine, butanamine, pentylamine, hexylamine, octylamine, nonylamine, decylamine, dodecylamine, hexadecylamine, octadecylamine, dimethylamine, diethylamine, dipropylamine, tributylamine, and trioctylamine; a carboxylic acid compound such as methanic acid, ethanoic acid, propane acid, butanoic acid, pentanoic acid, hexanoic acid, heptanoic acid, octanoic acid, dodecanoic acid, hexadecanoic acid, octadecanoic acid, oleic acid, and benzoic acid; a phosphine compound such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine compound such as a methyl phosphine oxide, an ethyl phosphine oxide, a propyl phosphine oxide, a butyl phosphine oxide, a pentyl phosphine oxide, a tributyl phosphine oxide, an octyl phosphine oxide, a dioctyl phosphine oxide, a trioctyl phosphine oxide, and the like, or an oxide compound thereof; diphenyl phosphine, a triphenyl phosphine compound, or an oxide compound thereof, a C5 to C20 alkyl phosphinic acid, a C5 to C20 alkyl phosphonic acid, such as hexylphosphinic acid, octylphosphinic acid, dodecanephosphinic acid, tetradecanephosphinic acid, hexadecanephosphinic acid, and octadecanephosphinic acid, and the like, but this is not restrictive. Quantum dots may contain a hydrophobic organic ligand alone or as a mixture of one or more types. The hydrophobic organic ligand may not contain a photopolymerizable moiety (e.g., an acrylate group, a methacrylate group, and the like).

A second insulation layer P2 may be positioned on the first color conversion layer CCL1, the second color conversion layer CCL2, and the transmissive layer CCL3. The second insulation layer P2 covers and protects the first color conversion layer CCL1, the second color conversion layer CCL2, and the transmissive layer CCL3, thereby preventing foreign particles from flowing into the first color conversion layer CCL1, the second color conversion layer CCL2, and the transmissive layer CCL3. The second insulation layer P2 may include an organic-inorganic hybrid material. The organic-inorganic hybrid material will be described later.

The second insulation layer P2 may be a single layer. The second insulation layer P2 may be in contact with the first color conversion layer CCL1, the second color conversion layer CCL2, and the transmissive layer CCL3. In addition, the second insulation layer P2 may be in contact with the first color filter CF1, the second color filter CF2, and the third color filter CF3. The second insulation layer P2 may contact both the first color conversion layer CCL1 and the first color filter CF1. The second insulation layer P2 may contact both the second color conversion layer CCL2 and the second color filter CF2. The second insulation layer P2 may contact both the transmissive layer CCL3 and the third color filter CF3. The second insulation layer P2 may be continuously formed over the first color conversion portion CC1, the second color conversion portion CC2, and the transmissive portion CC3.

The second insulation layer P2 according to the embodiment may include an organic-inorganic hybrid material. The second insulation layer P2 may include, for example, a polysilazane-based compound. The second insulation layer P2 may include, for example, a compound represented by Chemical Formula 1 below. The organic-inorganic hybrid material may include an organic material through any one of R1, R2, R3, R4, and R5 while including an inorganic material such as a Si—O bond or a Si—N bond as shown in Chemical Formula 1 below.

[Chemical Formula 1]

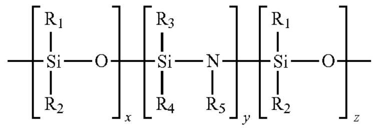

In Chemical Formula 1, $R_1$ and $R_2$ each independently include at least one of hydrogen, oxygen, nitrogen, an alkyl group, an epoxy group, and an acrylate group, $R_3$ and $R_4$ each independently contains an alkyl group or acrylate group having 1 to 5 carbon atoms, $R_5$ contains any one of an alkyl group, methoxy, and a double bond, and x, y, and z are random numbers among 1 to 10, respectively. In Chemical Formula 1, the sum of x and z may be less than or equal to y.

In Chemical Formula 1, $R_1$ and $R_2$ may improve adhesion with other layers. In addition, $R_5$ may include an electron donor group, and accordingly, reactivity of the compound represented by Chemical Formula 1 can be increased. The compound represented by Chemical Formula 1 with increased reactivity may be cured at a low temperature (for example, 180 degrees or less). In addition, photocuring may occur in $R_3$ and $R_4$ and the film density of the second insulation layer P2 can be improved.

In addition, the second insulation layer P2 according to the embodiment may be formed through a solution having viscosity of about 5 to 15 centipoises (cP). An inkjet process can be used through a solution having such a viscosity. In addition, the solution may contain solvent-free materials that do not contain solvents. The second insulation layer P2 may be formed through an inkjet process, but is not limited thereto, and may be formed through a slit process or the like.

The second insulation layer P2 may have a thickness of about 50 nanometers to about 5 micrometers. When the thickness of the second insulation layer P2 is less than 50 nanometers, the moisture permeability effect of the second insulation layer P2 may decrease. In addition, when the thickness of the second insulation layer P2 exceeds about 5 micrometers, there may be a problem that the thickness of the device becomes thicker.

The moisture permeability of the second insulation layer P2 may be about $10^{-3}$ grams per square meters per day ($g/m^2$/day) or less. The second insulation layer P2 may have a significantly lower moisture permeability compared to other layers having the same thickness. For example, an insulation layer of a silicon nitride material having a thickness of 1000 angstroms may have a moisture permeability of about 17.3 $g/m^2$/day. An insulation layer of a silicon nitride material having a thickness of 3000 angstroms may have moisture permeability of about 1.1 $g/m^2$/day. An insulation layer of a silicon nitride material having a thickness of 6000 angstroms may have a moisture permeability of about 0.4 $g/m^2$/day.

The display device according to the embodiment may be provided manufactured through a simple process by including a second insulation layer formed as a single layer. In addition, the second insulation layer can flatten a step difference of the first color conversion portion to the transmissive portion by including an organic-inorganic hybrid material. In addition, since a separate etching process for forming the second insulation layer can be omitted, the manufacturing process can be simplified.

The first color filter CF1, the second color filter CF2, and the third color filter CF3 may be positioned on the second insulation layer P2.

The first color filter CF1 may overlap with the first color conversion portion CC1 in a plan view. The first color filter CF1 transmits red light that has passed through the first color conversion layer CCL1 and absorbs light of a remaining wavelength, thereby increasing the purity of the red light emitted to the outside of the display device.

The second color filter CF2 may overlap with the second color conversion portion CC2 in a plan view. The second color filter CF2 transmits green light that has passed through the second color conversion layer CCL2 and absorbs light of a remaining wavelength, thereby increasing the purity of the green light emitted to the outside of the display device.

The third color filter CF3 may overlap the transmissive portion CC3 in a plan view. The third color filter CF3 transmits blue light that has passed through the transmissive layer CCL3 and absorbs light of a remaining wavelength, thereby increasing the purity of the blue light emitted to the outside of the display device.

A second light blocking member BM2 of the light blocking portion BM may be positioned between the first color filter CF1, the second color filter CF2, and the third color filter CF3. The second light blocking member BM2 may be formed by overlapping two or more of the first color filter CF1, the second color filter CF2, and the third color filter CF3 in a plan view. The color conversion portion CC according to the embodiment may provide a light blocking region that blocks light as a plurality of color filters overlap without a separate light blocking member in a plan view.

Figure 5:
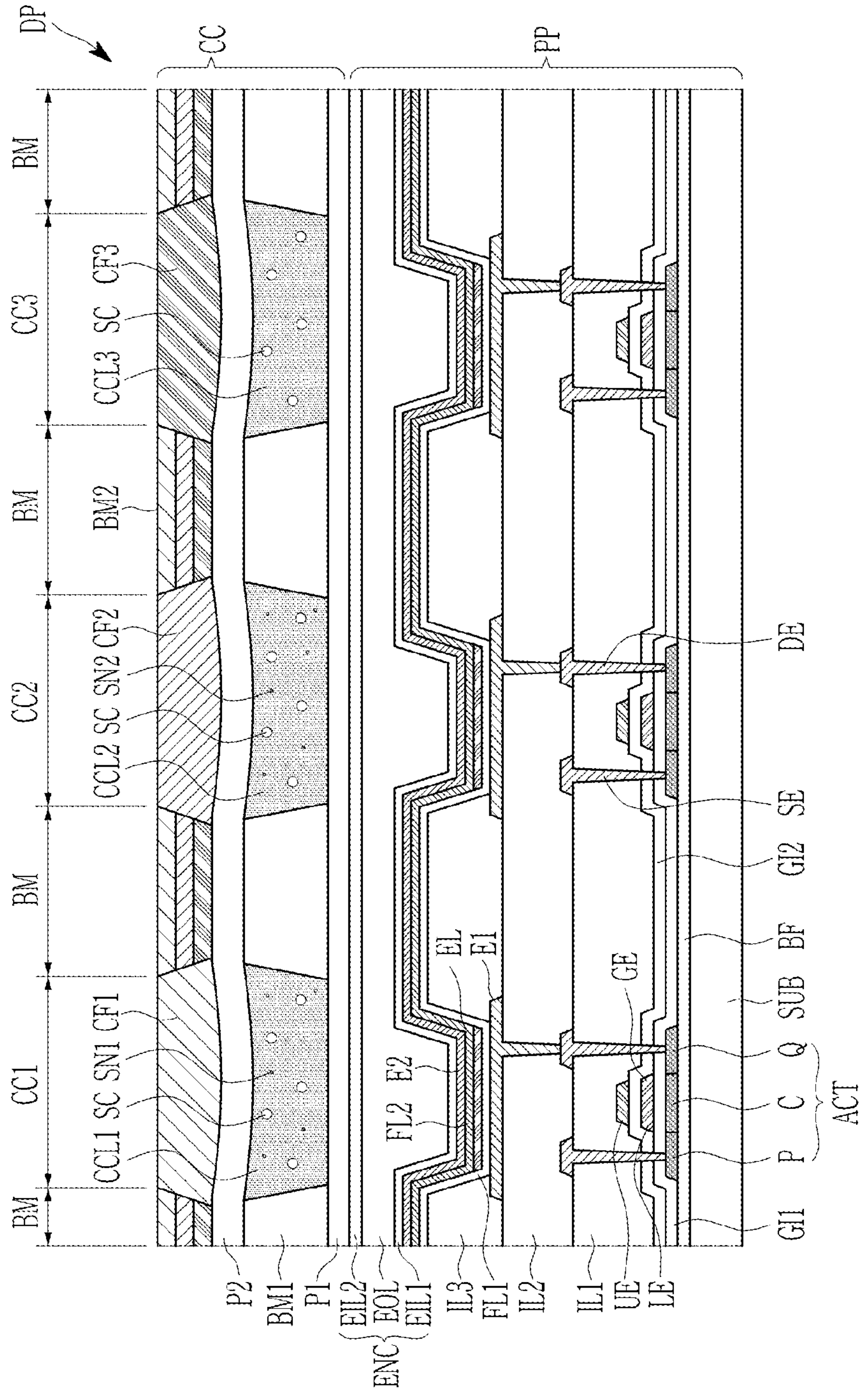
FIG. 5 is a cross-sectional view of a display panel according to an embodiment.

Hereinafter, referring to FIG. 5, a display panel according to an embodiment will be described. FIG. 5 is a cross-sectional view of a display panel according to an embodiment. A description of the above content and the same constituent elements will be omitted.

A first insulation layer P1 may be positioned on a display portion PP. A first color conversion layer CCL1, a second color conversion layer CCL2, and a transmissive layer CCL3 may be positioned on the first insulation layer P1.

A first light blocking member BM1 may be positioned on the first insulation layer P1. The first light blocking member BM1 may define a region in which the first color conversion layer CCL1, the second color conversion layer CCL2, and the transmissive layer CCL3 are positioned.

In the region defined by the first light blocking member BM1, the first color conversion layer CCL1, the second color conversion layer CCL2, and the transmissive layer CCL3 are positioned. The first color conversion layer CCL1, the second color conversion layer CCL2, and the transmissive layer CCL3 may be formed by an inkjet process, but are not limited thereto, and may be formed using any manufacturing method.

A second insulation layer P2 may be positioned on the first color conversion layer CCL1, the second color conversion layer CCL2, and the transmissive layer CCL3. The second insulation layer P2 may be formed by an inkjet process.

The first color filter CF1, the second color filter CF2, and the third color filter CF3 may be positioned on the upper surface of the second insulation layer P2.

The second light blocking member BM2 may have a form in which at least two or more of the first color filter CF1, the second color filter CF2, and the third color filter CF3 overlap each other in a plan view. The color conversion portion CC according to the embodiment may provide a light blocking region that blocks light as a plurality of color filters overlap without a separate light blocking member in a plan view.

Hereinafter, the display portion PP will be described in detail.

The display portion PP according to the embodiment includes a substrate SUB. The substrate SUB may include an inorganic insulating material such as glass or an organic insulating material such as plastic such as polyimide ("PI"). The substrate SUB may be single-layered or multi-layered. The substrate SUB may have a structure in which at least one base layer containing a polymer resin and at least one inorganic layer are alternately stacked.

The substrate SUB may have various degrees of flexibility. The substrate SUB may be a rigid substrate or a flexible substrate capable of bending, folding, or rolling.

A buffer layer BF may be positioned on the substrate SUB. The buffer layer BF blocks the transfer of impurity from the substrate SUB to an upper layer of the buffer layer BF, particularly, a semiconductor layer ACT, thereby preventing characteristic degradation of the semiconductor layer ACT and reducing stress. The buffer layer BF may include an inorganic insulating material or an organic insulating material such as a silicon nitride or a silicon oxide. A part or all of the buffer layer BF may be omitted.

The semiconductor layer ACT is positioned on the buffer layer BF. The semiconductor layer ACT may include at least one of polysilicon and an oxide semiconductor. The semiconductor layer ACT includes a channel area C, a first area P, and a second region Q. The first area P and the second region Q are disposed on opposite sides of the channel area C, respectively. The channel area C may include a semiconductor doped with a small amount of an impurity or not doped with an impurity, and a first area P and a second region Q may include a semiconductor doped with a large amount of an impurity compared to the channel area C. The semiconductor layer ACT may be formed of an oxide semiconductor. In this case, a separate protective layer (not shown) may be added to protect the oxide semiconductor material, which is vulnerable to external environments such as a high temperature.

A first gate insulation layer GI1 is positioned on the semiconductor layer ACT.

The gate electrode GE and the lower electrode LE are positioned on the first gate insulation layer GI1. Depending on embodiments, the gate electrode GE and the lower electrode LE may be integrally formed.

The gate electrode GE and the lower electrode LE may be a single layer or multilayer in which a metal film including any one of copper (Cu), a copper alloy, aluminum (Al), an aluminum alloy, molybdenum (Mo), a molybdenum alloy, titanium (Ti), and a titanium alloy is laminated. The gate electrode GE may overlap the channel area C of the semiconductor layer ACT in a plan view.

A second gate insulation layer GI2 may be positioned on the gate electrode GE and the first gate insulation layer GI1. The first gate insulation layer GI1 and the second gate insulation layer GI2 may be a single layer or multilayer including at least one of a silicon oxide ($SiO_x$), a silicon nitride ($SiN_x$), and a silicon oxynitride oxide ($SiO_xN_y$).

An upper electrode UE may be positioned on the second gate insulation layer GI2. The upper electrode UE may form a sustain capacitor while overlapping the lower electrode LE in a plan view.

The first interlayer-insulation layer IL1 is positioned on the upper electrode UE. The first interlayer-insulation layer IL1 may be a single layer or multilayer including at least one of a silicon oxide ($SiO_x$), a silicon nitride ($SiN_x$), and a silicon oxynitride oxide ($SiO_xN_y$).

The source electrode SE and drain electrode DE are positioned on the first interlayer-insulation layer IL1. The source electrode SE and the drain electrode DE are connected to the first area P and the second region Q of the semiconductor layer ACT through contact holes formed in the insulation layers, respectively.

The source electrode SE and the drain electrode DE may include aluminum (Al), silver (Ag), magnesium (Mg), gold (Au), nickel (Ni), chromium (Cr), nickel (Ni), calcium (Ca), molybdenium (Mo), titanium (Ti), tungsten (W), and/or copper (Cu), and may have a single-layer or multi-layer structure including the same.

A second interlayer-insulation layer IL2 is positioned on the first interlayer-insulation layer IL1, source electrode SE and drain electrode DE. The second interlayer-insulation layer IL2 may include an organic insulation material such as general general-purpose polymers such as poly(methyl methacrylate) ("PMMA") or polystyrene ("PS"), polymer derivatives with phenolic groups, acryl-based polymers, imide-based polymers, polyimide, and siloxane-based polymers.

The first electrode E1 may be positioned on the second interlayer-insulation layer IL2. The first electrode E1 may be connected to the drain electrode DE through a contact hole of the second interlayer-insulation layer IL2.

The first electrode E1 may include a metal such as silver (Ag), lithium (Li), calcium (Ca), aluminum (Al), magnesium (Mg), or gold (Au), or a transparent conductive oxide ("TCO") such as an indium tin oxide ("ITO") and an indium zinc oxide ("IZO"). The first electrode E1 may be formed of a single layer including a metallic material or a transparent conductive oxide, or a multi-layer including these. For example, the first electrode E1 may have a triple layer structure of indium tin oxide (ITO)/silver (Ag)/indium tin oxide (ITO).

A transistor formed of the gate electrode GE, the semiconductor layer ACT, the source electrode SE, and the drain electrode DE is connected to the first electrode E1 to supply a current to the light emitting diode.

A pixel-defining layer IL3 is positioned on the second interlayer-insulation layer IL2 and the first electrode E1. Although not shown, a spacer (not shown) may be positioned on the pixel-defining layer IL3. The pixel-defining layer IL3 defines a pixel-defining layer opening that overlaps at least a part of the first electrode E1 and defines a light emitting region in a plan view.

The pixel-defining layer IL3 may include an organic insulation material such as general general-purpose polymers such as poly(methyl methacrylate) (PMMA) or polystyrene (PS), polymer derivatives with phenolic groups, acryl-based polymers, imide-based polymers, polyimide, and siloxane-based polymers.

The pixel-defining layer IL3 may overlap with the above-stated first light blocking member BM1 and second light blocking member BM2 in a plan view. The pixel-defining layer IL3 may overlap the light blocking portion BM in a plan view.

An emission layer EL is positioned on the first electrode E1. Functional layers FL1 and FL2 may be positioned above and below the emission layer EL. The first function layer FL1 includes at least one of a hole injection layer ("HIL") and a hole transporting layer ("HTL"), and the second function layer FL2 may be a multilayer including at least one of an electron transporting layer ("ETL") and an electron injection layer ("EIL"). The function layers FL1 and FL2 can overlap the entire surface of the substrate SUB in a plan view.

The second electrode E2 is positioned on the function layers FL1 and FL2. The second electrode E2 may include a reflective metal containing calcium (Ca), barium (Ba), magnesium (Mg), aluminum (Al), silver (Ag), gold (Au), nickel (Ni), chromium (Cr), lithium (Li), calcium (Ca), and the like or a transparent conductive oxide (TCO) such as an indium tin oxide (ITO) or an indium zinc oxide (IZO).

The first electrode E1, the emission layer EL, the function layers FL1 and FL2, and the second electrode E2 may form a light emitting diode. Here, the first electrode E1 may be an anode that is a hole injection electrode, and the second electrode E2 may be a cathode that is an electron injection electrode. However, the embodiment is not limited thereto, and depending on a driving method of the light emitting display device, the first electrode E1 may become a cathode and the second electrode E2 may become an anode.

Holes and electrons are injected into the emission layer EL from the first electrode E1 and the second electrode E2, respectively, and light emission occurs when the excitons combined with the injected holes and electrons fall from an exited state to a ground state.

An encapsulation layer ENC is positioned on the second electrode E2. The encapsulation layer ENC may cover and seal not only the top surface but also the side surfaces of the light emitting diode. Since the light emitting diode is very vulnerable to moisture and oxygen, the encapsulation layer ENC seals the light emitting diode to block the inflow of external moisture and oxygen.

The encapsulation layer ENC may include a plurality of layers, and the encapsulation layer ENC may be formed as a composite film including both an inorganic layer and an organic layer. For example, the encapsulation layer ENC may be formed as a triple layer in which a first encapsulation layer EIL1, an encapsulation organic layer EOL, and a second encapsulation inorganic layer EIL2 are sequentially formed.

The first encapsulation inorganic layer EIL1 may cover the second electrode E2. The first encapsulation inorganic layer EIL1 may prevent external moisture or oxygen from penetrating into the light emitting diode. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be disposed on the first encapsulation inorganic layer EIL1 to contact the first encapsulation inorganic layer EIL1. Curves formed on the upper surface of the first encapsulation inorganic layer EIL1 or particles present on the first encapsulation inorganic layer EIL1 are covered by the encapsulation organic layer ("EOL"), and the surface state of the upper surface of the first encapsulation inorganic layer EIL1 is changed to the encapsulation organic layer (EOL) that can block the influence on the components formed on the encapsulation organic layer EOL. In addition, the encapsulation organic layer EOL may relieve stress between the contacting layers. The encapsulation organic layer EOL may include an organic material and may be formed through a solution process such as spin coating, slit coating, or an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface than is disposed on a first encapsulating inorganic layer DLL The second encapsulation inorganic layer EIL2 seals moisture emitted from the encapsulation organic layer EOL to prevent outflow to the outside. The second encapsulation inorganic layer EIL2 may include a silicon nitride, a silicon oxide, a silicon oxynitride, or a combination thereof. The second encapsulation inorganic layer EIL2 may be formed through a deposition process.

Although not illustrated in the present specification, a capping layer positioned between the second electrode E2 and the encapsulation layer ENC may be further included. The capping layer may include an organic material. The capping layer protects the second electrode E2 from the subsequent sputtering process and improves the light output efficiency of the light emitting diode. The capping layer may have a greater refractive index than the refractive index of the first encapsulation inorganic layer EIL1.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| PP: display portion | CC: color conversion portion |
| CC1: first color conversion portion | CC2: second color conversion portion |
| CC3: transmissive portion | BM: light blocking portion |
| CCL1: first color conversion layer | |
| CCL2: second color conversion layer | |
| CCL3: transmissive layer | BM1: first light blocking member |
| CF1, CF2, CF3: color filter | |

What is claimed is:

1. A display device comprising:

a display portion including a plurality of pixels; and a color conversion portion overlapping the display portion, wherein the color conversion portion comprises a first color conversion portion, a second color conversion portion, a transmissive portion, and a light blocking portion, the first color conversion portion comprises:

a first color conversion layer including first semiconductor nanocrystals and a first color filter overlapping the first color conversion layer, the second color conversion portion comprises:

a second color conversion layer including second semiconductor nanocrystals and a second color filter overlapping the second color conversion layer, the transmissive portion comprises a transmissive layer, the light blocking portion includes a first light blocking member and a second light blocking member, the color conversion portion further comprises an insulation layer positioned between the first color conversion layer and the first color filter, the insulation layer contacts both the first color conversion layer and the first color filter, the first light blocking member is positioned directly under the insulation layer, and the second light blocking member is positioned directly above the insulation layer, wherein the insulation layer comprises a polysilazane-based compound, the polysilazane-based compound comprises a compound represented by Chemical Formula 1:

(Chemical Formula 1)

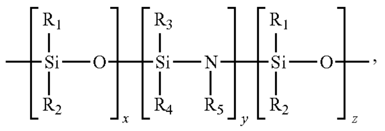

in Chemical Formula 1, $R_1$ and $R_2$ each independently include at least one of an epoxy group, and an acrylate group, $R_3$ and $R_4$ each independently contain an alkyl group or acrylate group having 1 to 5 carbon atoms, $R_5$ contains any one of an alkyl group, a methoxy group, and a double bond, and x, y, and z are integers among 1 to 10, respectively.

2. The display device of claim 1, wherein the insulation layer is continuously disposed across the first color conversion portion, the second color conversion portion, and the transmissive portion.

3. The display device of claim 1, wherein the insulation layer contacts the first color conversion layer, the second color conversion layer, and the transmissive layer.

4. The display device of claim 3, wherein the transmissive portion further comprises a third color filter overlapping the transmissive layer, and the insulation layer contacts the first color filter, the second color filter, and the third color filter.

5. The display device of claim 3, wherein the insulation layer is a single layer.

6. The display device of claim 1, wherein in Chemical Formula 1, a sum of x and z is less than or equal to y.

7. The display device of claim 1, wherein the insulation layer is formed through an inkjet process.

8. The display device of claim 1, wherein a thickness of the insulation layer is about 50 nanometers to about 5 micrometers.

9. A display device comprising:

a display portion including a plurality of pixels: and a color conversion portion overlapping the display portion, wherein the color conversion portion comprises a first color conversion portion, a second color conversion portion, a transmissive portion, and a light blocking portion, the first color conversion portion comprises a first color conversion layer including first semiconductor nanocrystals and a first color filter overlapping the first color conversion layer, the second color conversion portion comprises a second color conversion layer including second semiconductor nanocrystals and a second color filter overlapping the second color conversion layer, the transmissive portion includes, a transmissive layer and a third color filter overlapping the transmissive layer, the light blocking portion includes a first light blocking member and a second light blocking member, the color conversion portion further comprises an insulation layer positioned between the first color conversion layer and the first color filter, the insulation layer contacts both the first color conversion layer and the first color filter, the first light blocking member is positioned directly under the insulation layer, the second light blocking member is positioned directly above the insulation layer, and the insulation layer contains an organic-inorganic hybrid material, wherein the insulation layer comprises a polysilazane-based compound, the polysilazane-based compound comprises a compound represented by Chemical Formula 1:

(Chemical Formula 1)

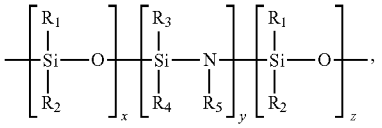

in Chemical Formula 1, $R_1$ and $R_2$ each independently include at least one of an epoxy group, and an acrylate group, $R_3$ and $R_4$ each independently contain an alkyl group or acrylate group having 1 to 5 carbon atoms, $R_5$ contains any one of an alkyl group, a methoxy group, and a double bond, and x, y, and z are integers among 1 to 10, respectively.

10. The display device of claim 9, wherein the insulation layer is continuously disposed across the first color conversion portion, the second color conversion portion, and the transmissive portion.

11. The display device of claim 10, wherein the insulation layer contacts the first color conversion layer, the second color conversion layer, and the transmissive layer.

12. The display device of claim 10, wherein the insulation layer contacts the first color filter, the second color filter, and the third color filter.

13. The display device of claim 10, wherein the insulation layer is a single layer.

14. The display device of claim 9, wherein the insulation layer is formed through an inkjet process.

15. The display device of claim 9, wherein a thickness of the insulation layer is about 50 nanometers to about 5 micrometers.

16. The display device of claim 9, wherein moisture permeability of the insulation layer is about $10^{-3}$ grams per square meters per day ($g/m^2/day$) or less.

* * * * *